US012610789B2

(12) United States Patent
Liu et al.

(10) Patent No.: US 12,610,789 B2
(45) Date of Patent: *Apr. 21, 2026**

(54) METHOD OF MANUFACTURING A SEMICONDUCTOR DEVICE AND PATTERN FORMATION METHOD

(71) Applicant: Taiwan Semiconductor Manufacturing Company, Ltd., Hsinchu (TW)

(72) Inventors: Chih-Cheng Liu, Hsinchu (TW); Ming-Hui Weng, New Taipei City (TW); Jr-Hung Li, Chupei City (TW); Yahru Cheng, Taipei (TW); Chi-Ming Yang, Hsinchu City (TW); Tze-Liang Lee, Hsinchu (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/786,266

(22) Filed: Jul. 26, 2024

(65) Prior Publication Data

US 2024/0387173 A1     Nov. 21, 2024

Related U.S. Application Data

(63) Continuation of application No. 17/316,221, filed on May 10, 2021, now Pat. No. 12,159,787.

(Continued)

(51) Int. Cl.
$H01L\ 21/027$ (2006.01)
$C23C\ 16/04$ (2006.01)
$C23C\ 16/455$ (2006.01)

(52) U.S. Cl.
CPC ........ *H01L 21/0274* (2013.01); *C23C 16/042* (2013.01); *C23C 16/45525* (2013.01)

(58) Field of Classification Search
None
See application file for complete search history.

(56) References Cited

U.S. PATENT DOCUMENTS

| | | | |
|---|---|---|---|
| 8,318,830 B2 | 11/2012 | Kohli Steck et al. | |
| 12,159,787 B2 * | 12/2024 | Liu ..................... | H01L 21/0274 |

(Continued)

FOREIGN PATENT DOCUMENTS

| | | |
|---|---|---|
| TW | 201035049 A | 10/2010 |
| TW | 201035118 A | 10/2010 |

(Continued)

OTHER PUBLICATIONS

Kenane, N. et al. "Hydrolysis and Condensation of n-BuSnCl3: Enabling Deposition of Smooth Metal Oxide Photoresist Thin Films", Inorg. Chem. 2020, 59, 6, 3934-3941. (Year: 2020).

(Continued)

*Primary Examiner* — Alexander M Weddle
(74) *Attorney, Agent, or Firm* — STUDEBAKER BRACKETT PLLC

(57) ABSTRACT

In a pattern formation method, a photoresist layer is formed over a substrate by combining a first precursor and a second precursor in a vapor state to form a photoresist material. The first precursor is an organometallic having a formula $M_a R_b X_c$, where M is one or more selected from the group consisting of Sn, Bi, Sb, In, and Te, R is an alkyl group that is substituted by different EDG and/or EWG, X is a halide or sulfonate group, and $1 \le a \le 2$, $b \ge 1$, $c \ge 1$, and $b+c \le 4$. The second precursor is water, an amine, a borane, and/or a phosphine. The photoresist material is deposited over the substrate, and selectively exposed to actinic radiation to (Continued)

I: monomer          II: dimer or $M_a R_b X_c$
a:1~2 (monomer or dimer)
b ≥1, c≥1
b&c: b+c ≤ 4 per M.

form a latent pattern, and the latent pattern is developed by applying a developer to the selectively exposed photoresist layer to form a pattern.

20 Claims, 19 Drawing Sheets

Related U.S. Application Data

(60) Provisional application No. 63/049,956, filed on Jul. 9, 2020, provisional application No. 63/047,350, filed on Jul. 2, 2020.

(56) References Cited

U.S. PATENT DOCUMENTS

| | | |
|---|---|---|
| 2011/0267714 A1 | 11/2011 | Makino et al. |
| 2012/0242940 A1 | 9/2012 | Nagata et al. |
| 2013/0034812 A1 | 2/2013 | Shimada et al. |
| 2013/0087779 A1 | 4/2013 | Park et al. |
| 2020/0124970 A1 | 4/2020 | Kocsis et al. |
| 2023/0072538 A1 | 3/2023 | Liu et al. |

FOREIGN PATENT DOCUMENTS

| | | | |
|---|---|---|---|
| TW | 201135366 A | 10/2011 | |
| TW | 201200975 A | 1/2012 | |
| TW | 201238979 A | 10/2012 | |
| TW | 201902951 A | 1/2019 | |
| WO | 2019/199467 A1 | 10/2019 | |
| WO | WO-2019217749 A1 * | 11/2019 | ......... H01L 21/0332 |

OTHER PUBLICATIONS

Non-Final Office Action issued in U.S. Appl. No. 17/316,221, dated Sep. 11, 2023.
Final Office Action issued in U.S. Appl. No. 17/316,221, dated Apr. 12, 2024.
Notice of Allowance issued in U.S. Appl. No. 17/316,221, dated Jul. 19, 2024.

* cited by examiner $M_aR_bX_c$ a:1~2 (monomer or dimer)

b ≥1, c≥1 b&c: b+c ≦ 4 per M.

I: monomer

II: dimer or $M_aR_bX_c$ a: 1~2 (monomer or dimer)

b ≥1, c≥1 b&c: b+c ≦ 4 per M.

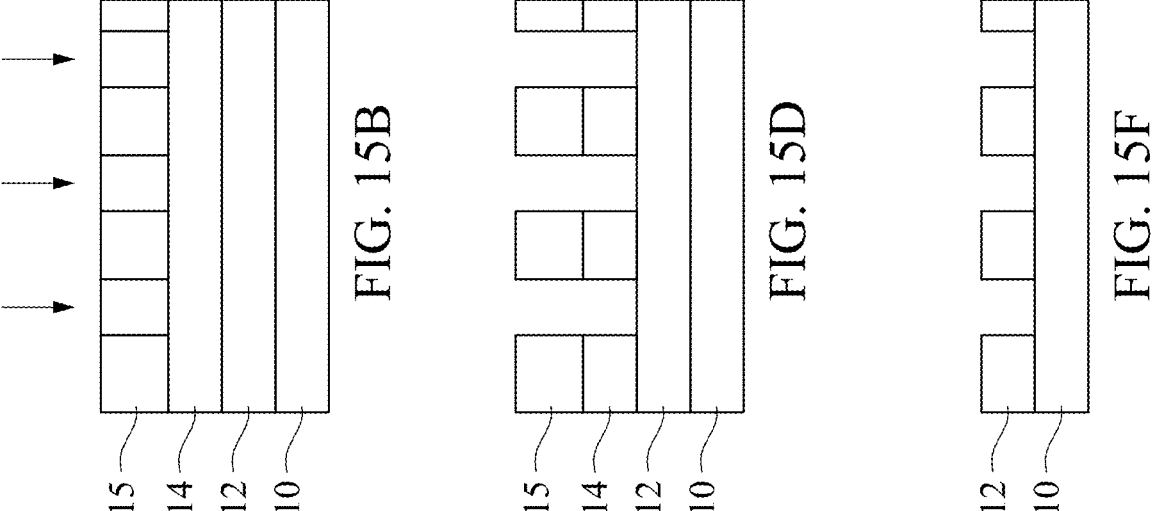
FIG. 15B
FIG. 15D
FIG. 15F
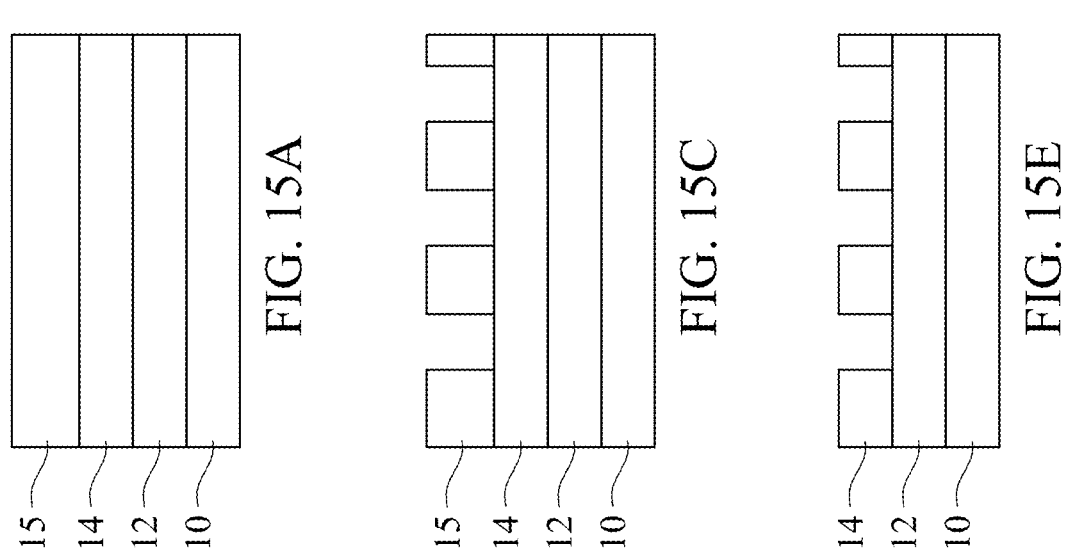
FIG. 15A
FIG. 15C
FIG. 15E

METHOD OF MANUFACTURING A SEMICONDUCTOR DEVICE AND PATTERN FORMATION METHOD

RELATED APPLICATIONS

This application is continuation of U.S. patent application Ser. No. 17/316,221 filed May 10, 2021, which claims priority to U.S. Provisional Patent Application No. 63/047,350 filed on Jul. 2, 2020 and U.S. Provisional Patent Application No. 63/049,956 filed on Jul. 9, 2020, the entire contents of each of which are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 15A, 15B, 15C, 15D, 15E and 15F show various stages of a sequential manufacturing operation of a semiconductor device according to an embodiment of the present disclosure.

DETAILED DESCRIPTION

Figure 1:
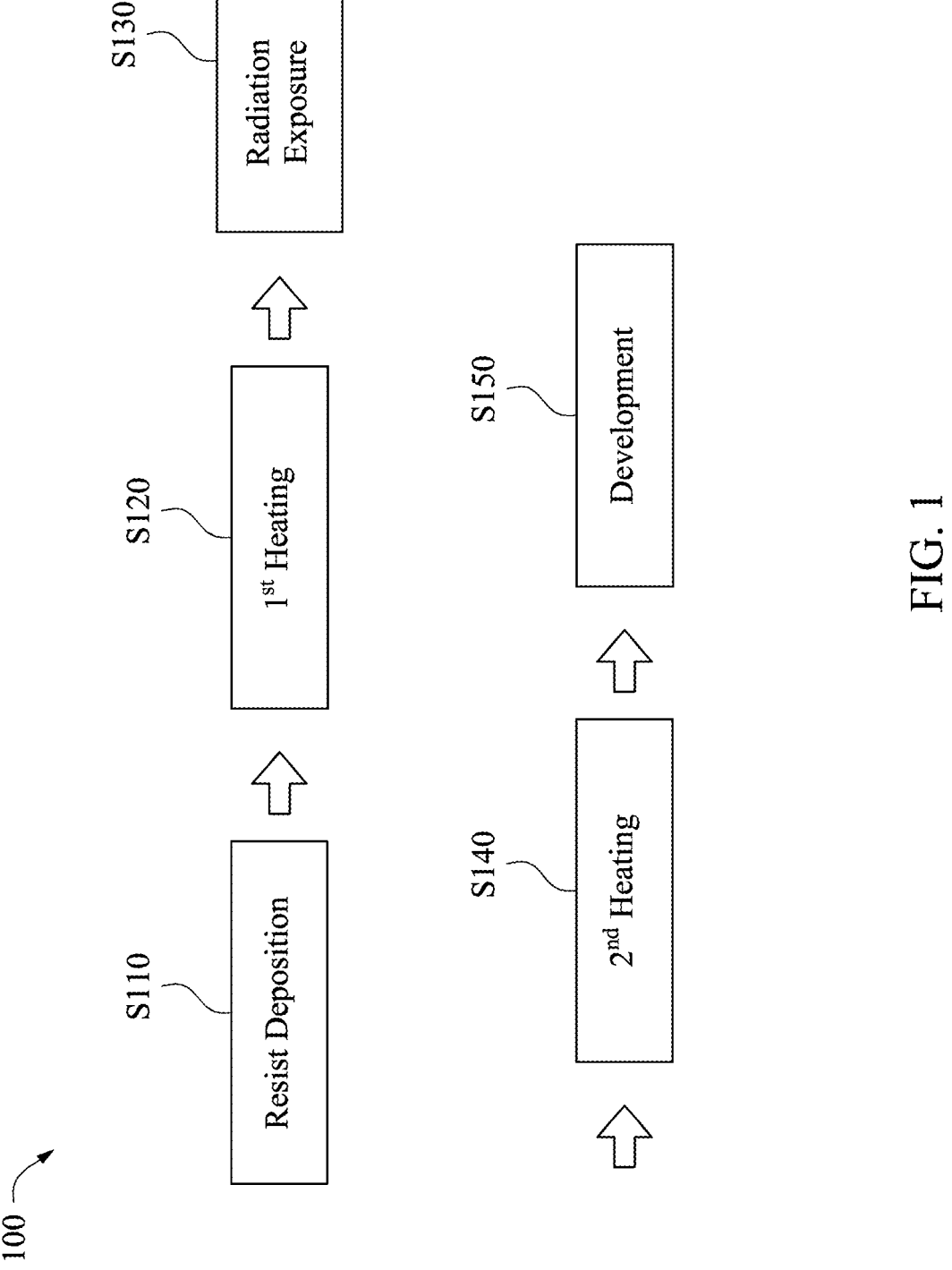
FIG. 1 illustrates a process flow of manufacturing a semiconductor device according to embodiments of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

As the semiconductor industry has progressed into nanometer technology process nodes in pursuit of higher device density, higher performance, and lower costs, there have been challenges in reducing semiconductor feature size.

Extreme ultraviolet lithography (EUVL) has been developed to form smaller semiconductor device feature size and increase device density on a semiconductor wafer. In order to improve EUVL, an increase in wafer exposure throughput is desirable. Wafer exposure throughput can be improved through increased exposure power or increased resist photospeed (sensitivity). On the other hand, in order to reduce costs it is desirable to reduce the extreme ultraviolet (EUV) dosage.

Metal-containing photoresists are used in extreme ultraviolet (EUV) lithography because metals have a high absorption capacity of extreme ultraviolet radiation and thus increase the resist photospeed. Metal-containing photoresist layers, however, may outgas during processing which can cause the photoresist layer quality to change over time and may cause contamination, thereby negatively affecting lithography performance, and increasing defects.

Furthermore, uneven exposure of the photoresist, especially at deeper portions of the photoresist layer may result in an uneven degree of cross-linking of the photoresist. Uneven exposure results from a lower amount of light energy reaching the lower portions of the photoresist layer. The uneven exposure may result in poor line width roughness (LWR) thereby preventing the formation of a straight edge resist profile.

Further, the solvents used in the formation of and developing solvent-based photoresists may be toxic. A greener process of photoresist layer formation and subsequent pattern formation without using toxic solvents is desirable.

Moreover, a spin coating processes may use only 2-5% of the material dispensed onto the substrate, while the remaining 95-98% is flung off during the spin-coating operation. A photoresist deposition operation with high material use efficiency is desirable.

Furthermore, the density of spin-coated photoresist films may not be uniform. Aggregation of the photoresist film may occur in some portions.

In addition, photoresist layer formation and patterning operations that substantially reduce or prevent metal contamination of the processing chambers and substrate handling equipment from the metals in metal-containing photoresists is desirable.

In embodiments of the disclosure, the above issues are addressed by depositing a photoresist on a substrate by a vapor deposition operation, including atomic layer deposition (ALD) or chemical vapor deposition (CVD) of the photoresist material. Photoresist layers deposited by a vapor phase deposition operation according to embodiments of the disclosure provide photoresist layers that have controllable film thickness, and high film uniformity and density, over a large deposition area. In addition, embodiments of the disclosure include solvent free photoresist layer formation, thus providing a greener process. Moreover, the photoresist deposition operation is a one-pot method (carried out in a single chamber) in some embodiments, thus increasing the manufacturing efficiency, and limiting or preventing metal contamination of processing chambers. In some embodiments, bond dissociation energy (BDE) tuning is used to increase the efficiency of the EUV exposure operation.

Figure 2:
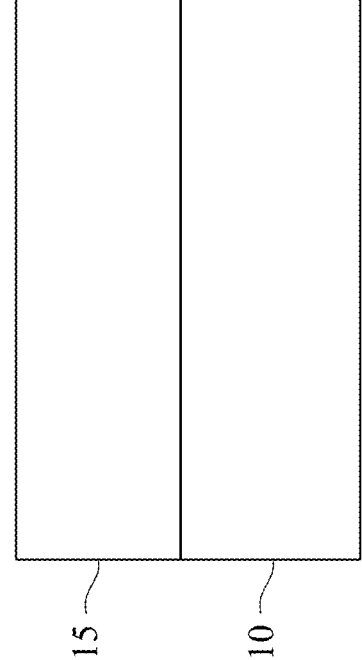
FIG. 2 shows a process stage of a sequential operation according to an embodiment of the disclosure.

FIG. 1 illustrates a process flow 100 of manufacturing a semiconductor device according to embodiments of the disclosure. A resist is coated on a surface of a layer to be patterned or a substrate 10 in operation S110, in some embodiments, to form a resist layer 15, as shown in FIG. 2. In some embodiments, the resist is a metal-containing photoresist formed by CVD or ALD. In some embodiments, the resist layer 15 then undergoes a first heating operation S120 after being deposited. In some embodiments, the resist layer is heated to a temperature of about 40° C. to about 120° C. for about 10 seconds to about 10 minutes.

After the optional first heating operation S120 or the resist deposition operation S110, the photoresist layer 15 is selectively exposed to actinic radiation 45/97 (see FIGS. 3A and 3B) in operation S130. In some embodiments, the photoresist layer 15 is selectively or patternwise exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the photoresist layer is selectively or patternwise exposed to an electron beam.

Figure 3A:
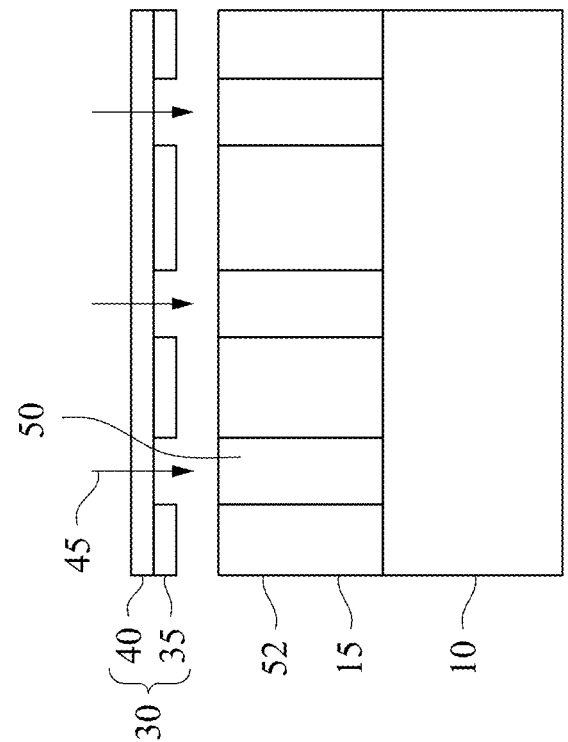
FIGS. 3A and 3B show a process stage of a sequential operation according to an embodiment of the disclosure.

As shown in FIG. 3A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 3B:
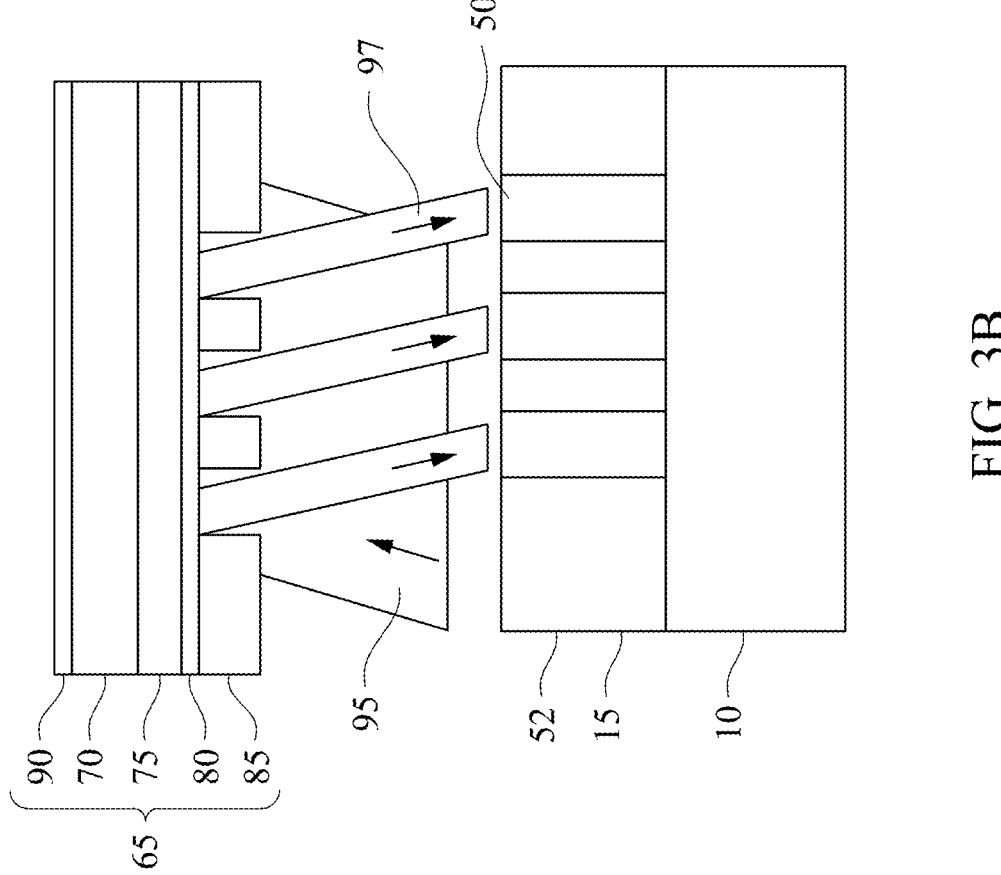

In some embodiments, the selective or patternwise exposure of the photoresist layer 15 to form exposed regions 50 and unexposed regions 52 is performed using extreme ultraviolet lithography. In an extreme ultraviolet lithography operation, a reflective photomask 65 is used to form the patterned exposure light in some embodiments, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. Extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are located between the reflective photomask 65 and the photoresist-coated substrate.

In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is one or more of, for example, a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

The amount of electromagnetic radiation can be characterized by a fluence or dose, which is obtained by the integrated radiative flux over the exposure time. Suitable radiation fluences range from about 1 mJ/cm$^2$ to about 150 mJ/cm$^2$ in some embodiments, from about 2 mJ/cm$^2$ to about 100 mJ/cm$^2$ in other embodiments, and from about 3 mJ/cm$^2$ to about 50 mJ/cm$^2$ in other embodiments. A person of ordinary skill in the art will recognize that additional ranges of radiation fluences within the explicit ranges above are contemplated and are within the present disclosure.

In some embodiments, the selective or patternwise exposure is performed by a scanning electron beam. With electron beam lithography, the electron beam induces secondary electrons, which modify the irradiated material. High resolution is achievable using electron beam lithography and the metal-containing resists disclosed herein. Electron beams can be characterized by the energy of the beam, and suitable energies range from about 5 V to about 200 kV (kilovolt) in some embodiments, and from about 7.5 V to about 100 kV in other embodiments. Proximity-corrected beam doses at 30 kV range from about 0.1 µC/cm$^2$ to about 5 µC/cm$^2$ in some embodiments, from about 0.5 µC/cm$^2$ to about 1 µC/cm$^2$ in other embodiments, and in other embodiments from about 1 µC/cm$^2$ to about 100 µC/cm$^2$. A person of ordinary skill in the art can compute corresponding doses at other beam energies based on the teachings herein and will recognize that additional ranges of electron beam properties within the explicit ranges above are contemplated and are within the present disclosure.

The region 50 of the photoresist layer exposed to radiation undergoes a chemical reaction thereby changing its susceptibility to being removed in a subsequent development operation S150. In some embodiments, the portion 50 of the photoresist layer exposed to radiation undergoes a reaction making the exposed portion more easily removed during the development operation S150. In other embodiments, the portion of the photoresist layer exposed to radiation 50 undergoes a reaction making the exposed portion resistant to removal during the development operation S150.

Next, the photoresist layer 15 undergoes a second heating or a post-exposure bake (PEB) in operation S140. In some embodiments, the photoresist layer 15 is heated to a temperature of about 50° C. to about 250° C. for about 20 seconds to about 120 seconds. In some embodiments, the post-exposure baking is performed at a temperature ranging from about 100° C. to about 230° C., and at a temperature ranging from about 150° C. to about 200° C. in other embodiments. In some embodiments, the post-exposure baking operation S140 causes the reaction product of a first compound or first precursor and a second compound or second precursor to crosslink.

Figure 4A:
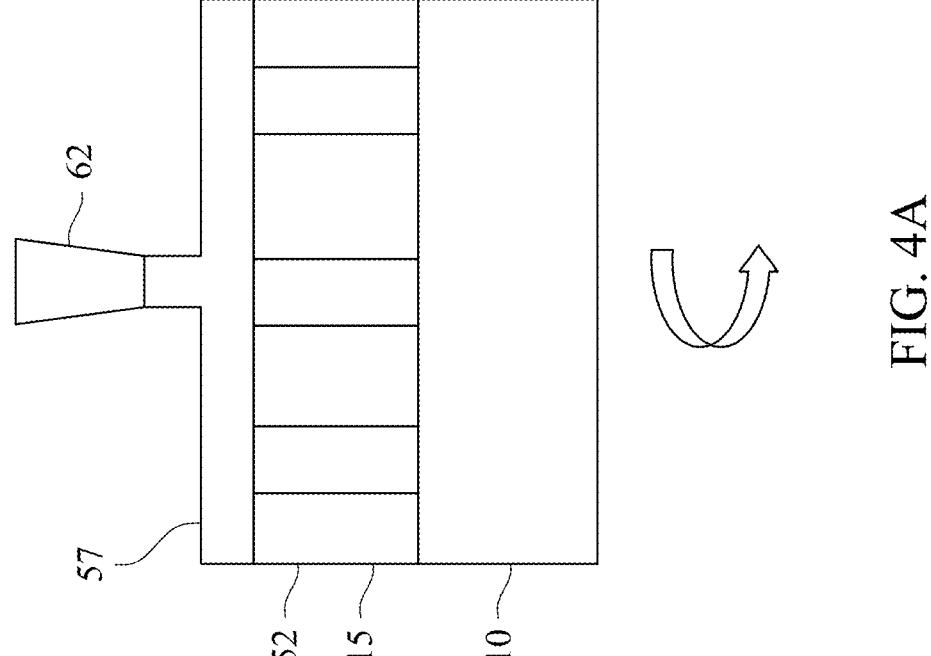
FIGS. 4A and 4B show a process stage of a sequential operation according to an embodiment of the disclosure.
Figures 5, 6:
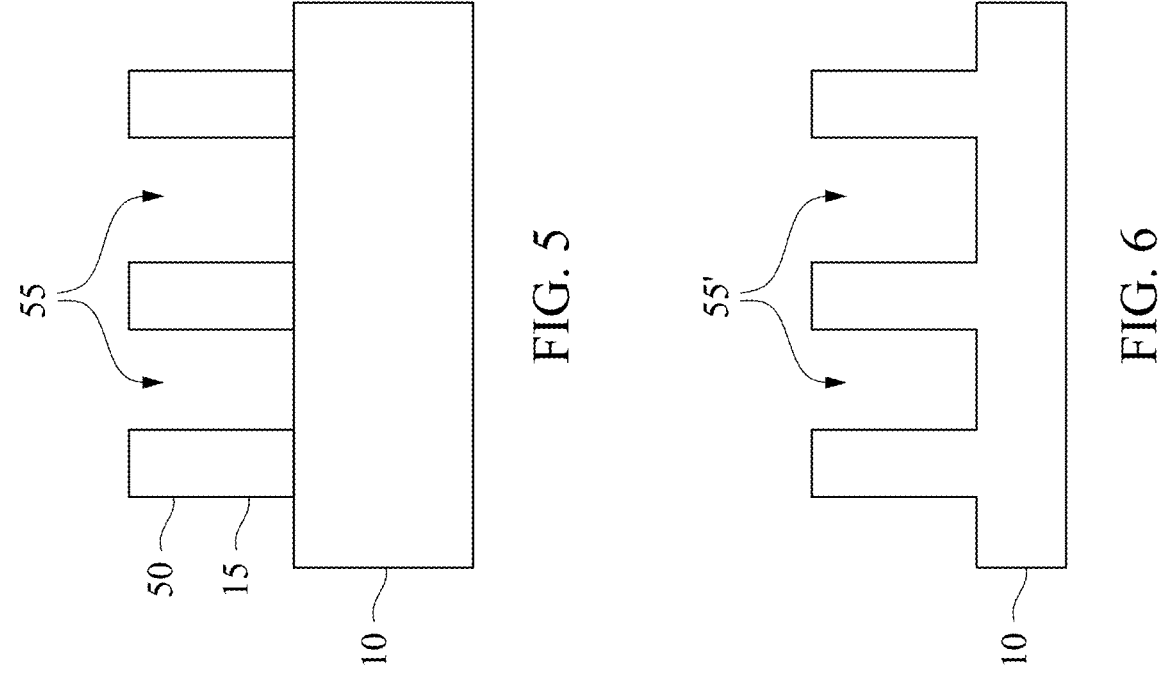
FIG. 5 shows a process stage of a sequential operation according to an embodiment of the disclosure.
FIG. 6 shows a process stage of a sequential operation according to an embodiment of the disclosure.

The selectively exposed photoresist layer is subsequently developed in operation S150. In some embodiments, the photoresist layer 15 is developed by applying a solvent-based developer 57 to the selectively exposed photoresist layer. As shown in FIG. 4A, a liquid developer 57 is supplied from a dispenser 62 to the photoresist layer 15. In some embodiments, the exposed portions 50 of the photoresist undergo a crosslinking reaction as a result of the exposure to actinic radiation or the post-exposure bake, and the unexposed portion of the photoresist layer 52 is removed by the developer 57 forming a pattern of openings 55 in the photoresist layer 15 to expose the substrate 20, as shown in FIG. 5.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer 57 is applied to the photoresist layer 15 using a spin-on process. In the spin-on process, the developer 57 is applied to the photoresist layer 15 from above the photoresist layer 15 while the photoresist-coated substrate is rotated, as shown in FIG. 4A. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. during the development operation. The development operation continues for between about 30 seconds to about 10 minutes in some embodiments.

In some embodiments, the developer 57 is an organic solvent. The organic solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, 4-methyl-2-pentanol, acetone, methyl ethyl ketone, dimethylformamide (DMF), isopropanol (IPA), tetrahydrofuran (THF), methyl isobutyl carbinol (MIBC), n-butyl acetate (nBA), 2-heptanone (MAK), tetrahydrofuran (THF), and dioxane.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

Figure 4B:
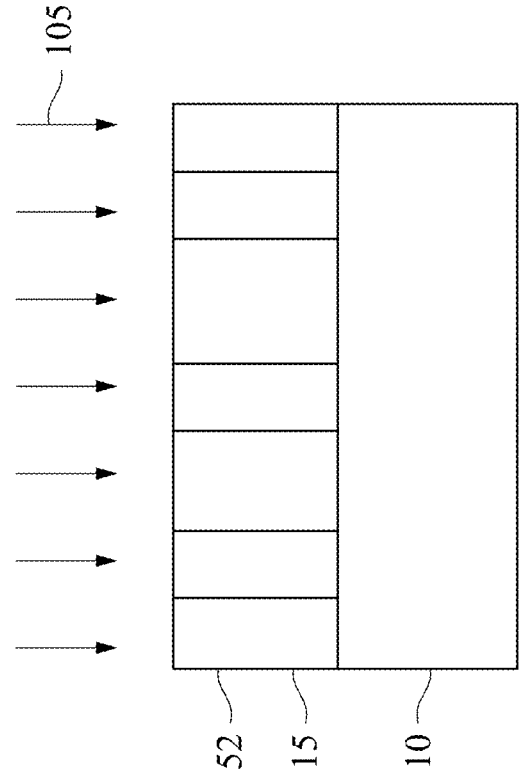

In some embodiments, a dry developer 105 is applied to the selectively exposed photoresist layer 15, as shown in FIG. 4B. In some embodiments, the dry developer 105 is a plasma or chemical vapor, and the dry development operation S150 is a plasma etching or chemical etching operation. The dry development uses the differences related to the composition, extent of cross-linking, and film density to selectively remove the desired portions of the resist. In some embodiments, the dry development processes uses either a gentle plasma (high pressure, low power) or a thermal process in a heated vacuum chamber while flowing a dry development chemistry, such as $Cl_2$, $CHCl_3$, $CH_2Cl_2$, $CH_4$, $CF_4$, $N_2$, $BF_3$, $BCl_3$, $CCl_4$, HCl, $O_2$, $NF_3$, $NH_3$, $N_2H_2$, HBr and $NO_2$, or other Lewis Acid in the vapor state. In some embodiments, the $BCl_3$ removes the unexposed material, leaving behind a pattern of the exposed film that is transferred into the underlying layers by plasma-based etch processes.

In some embodiments, the dry development includes plasma processes, including transformer coupled plasma (TCP), inductively coupled plasma (ICP) or capacitively coupled plasma (CCP). In some embodiments, the plasma process is conducted at a pressure of ranging from about 5 mTorr to a pressure of about 20 mTorr, at a power level from about 250 W to about 1000 W, temperature ranging from about 0° C. to about 300° C., and at flow rate of about 100 to about 1000 sccm, for about 1 to about 3000 seconds.

After the development operation, additional processing is performed while the patterned photoresist layer 50 is in place. For example, an etching operation, using dry or wet etching, is performed in some embodiments, to transfer the pattern of the photoresist layer 50 to the underlying substrate 10, forming recesses 55' as shown in FIG. 6. The substrate 10 has a different etch resistance than the photoresist layer 15. In some embodiments, the etchant is more selective to the substrate 10 than the photoresist layer 15.

In some embodiments, the exposed photoresist layer 15 is at least partially removed during the etching operation. In other embodiments, the exposed photoresist layer 15 is removed after etching the substrate 10 by selective etching, using a suitable photoresist stripper solvent, or by a photo-resist plasma ashing operation.

In some embodiments, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric material having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

In some embodiments, a bottom antireflective coating (BARC) layer is formed between the substrate and the metallic photoresist layer 15.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. A positive tone resist refers to a photoresist material that when developed, the portions of the photoresist layer exposed to actinic radiation, such as UV light, are removed, while the region of the photoresist that is non-exposed (or exposed less) remains on the substrate after the development operation. A negative tone resist, on the other hand, refers to a photoresist material that when developed, the portions of the photoresist exposed to actinic radiation remain on the substrate after the development operation, while the region of the photoresist that is non-exposed (or exposed less) is removed during the development operation.

Figure 7A:
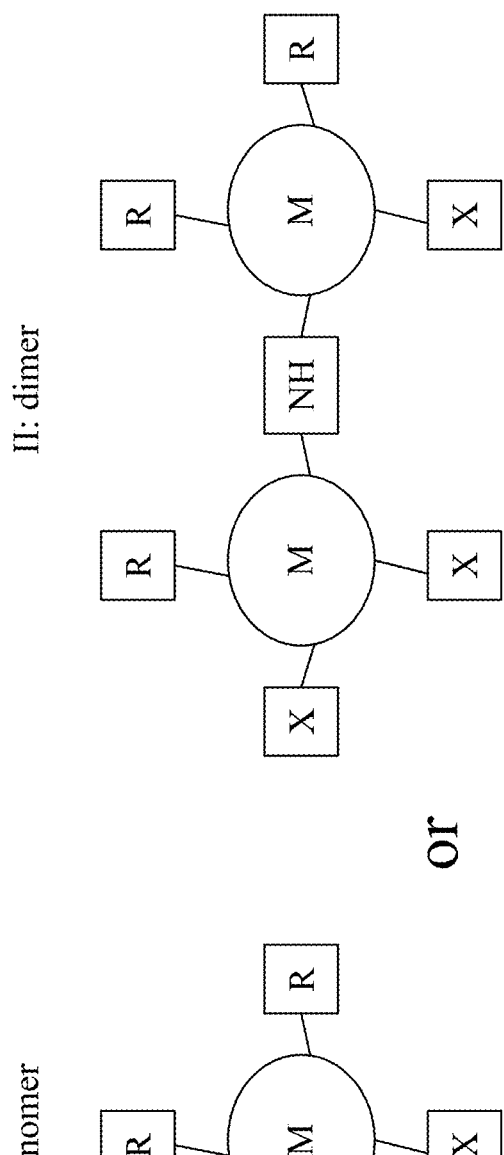
FIG. 7A shows organometallic precursors according to embodiments of the disclosure.
Figure 7B:
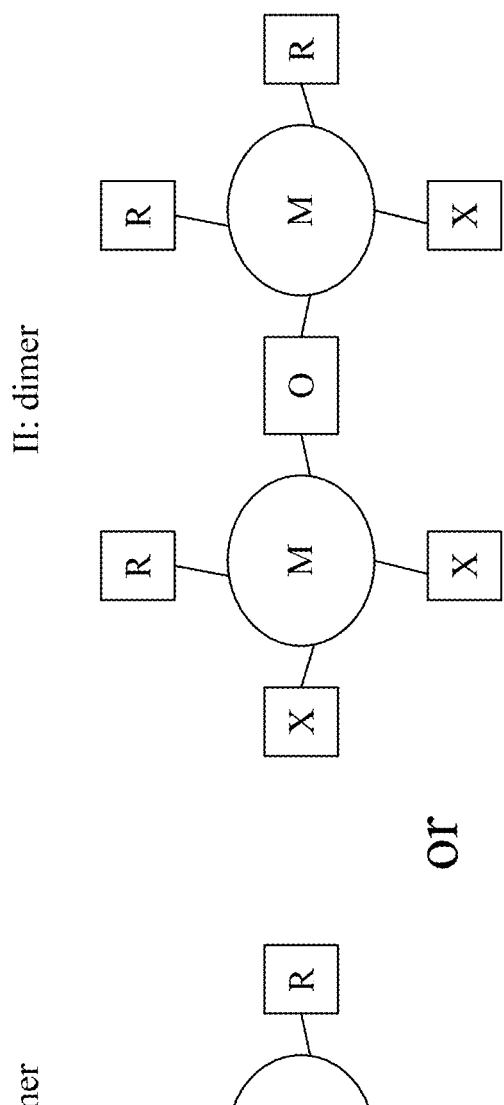
FIG. 7B shows organometallic precursors according to embodiments of the disclosure.

In some embodiments, the photoresist layer 15 is made of a photoresist composition, including a first compound or a first precursor and a second compound or a second precursor combined in a vapor state. The first precursor or first compound is an organometallic having a formula: $M_aR_bX_c$ (a, b and c are natural number), as shown in FIGS. 7A and 7B, where M is one or more selected from the group consisting of Sn, Bi, Sb, In, and Te; R is a substituted or unsubstituted alkyl, alkenyl, or carboxylate group. In some embodiments, X is a ligand, ion, or other moiety, which is reactive with the second compound or second precursor; and $1 \leq a \leq 2$, $b \geq 1$, $c \geq 1$, and $b+c \leq 4$. In certain embodiments, $b+c=4$. In some embodiments, the alkyl, alkenyl, or carboxylate group is substituted with one or more fluoro groups. In some embodiments, the organometallic precursor is a dimer, as shown in FIG. 7A, where each monomer unit is linked by an amine group. In some embodiments, $b=c=2$. In other embodiments, the organometallic precursor is a dimer, as shown in FIG. 7B, where each monomer unit is linked by oxygen. In some embodiments, $b=1$ and $c=3$. Each monomer has a formula: $M_aR_bX_c$, as defined above.

In some embodiments, R in the formula $M_aR_bX_c$ includes alkyl groups that are substituted by different electron-donating groups (EDG) and/or electron-withdrawing groups (EWG) to tune the bond dissociation energy to provide a bond that is cleaved by a low EUV dosage. In some embodiments, R is a substituted or unsubstituted C1-C20 alkyl group, including all isomers of C1-C20 alkyl groups. The EDG include oxido group (—O⁻), amino groups (—NH₂, —NHR, —NR₂, where R=C1-C4 groups and phenyl groups), hydroxyl and alkoxyl groups (—OH, —OR, where R=C1-C4 groups, and phenyl groups), acylamido groups (—NHCOR, where R=C1-C4 groups and phenyl groups), alkylthio and sulfhydryl groups (—SH, —SR, where R=C1-C4 groups and phenyl groups), phenyl group, and carboxylate groups (—(C═O)O—). The EWG include halide groups (—I, —Cl, —Br, —F), ammonium groups (—NR₃⁺, where R=C1-C4 groups and phenyl groups), nitro groups (—NO₂), sulfonic acids and sulfonyl groups (—SO₃H, —SO₂R, where R=C1-C4 groups and phenyl groups), cyano group (—CN), formyl and acyl groups (—CHO, —COR, where R=C1-C4 groups and phenyl groups), carboxyl and alkoxycarbonyl groups (—CO₂H, —CO₂R, where R=C1-C4 groups and phenyl groups), and aminocarbonyl groups (—CONH₂, —CONHR, —CONR, where R=C1-C4 groups and phenyl groups), where the C1-C4 groups include all isomers of the C1-C4 groups.

In some embodiments, the first precursor or compound having the formula $M_aR_bX_c$, R includes all structural isomers of C1-C4 alkyl groups substituted with a phenyl group, an amino group (—NH₂, —NHR, —NR₂, where R=C1-C3 alkyl group), hydroxyl and alkoxyl groups (—OH, —OR, where R=C1-C3 alkyl group and a phenyl group). In some embodiments, the first precursor or compound having the formula $M_aR_bX_c$, R includes C1-C4 alkyl groups substituted at the α-C position by one or two phenyl groups, an amino group (—$NH_2$, —NHR, —$NR_2$, where R=C1, C2 or C3 alkyl group), and alkoxyl groups (—OR, where R=C1, C2 or C3 alkyl group).

In some embodiments, X is any moiety readily displaced by the second compound or second precursor to generate an M-OH moiety, such as a moiety selected from the group consisting of amines, including dialkylamino and monoalkylamino; alkoxy; carboxylates, halogens, and sulfonates. In some embodiments, the sulfonate group is substituted with one or more amine groups. In some embodiments, the halide is one or more selected from the group consisting of F, Cl, Br, and I. In some embodiments, the sulfonate group includes a substituted or unsubstituted C1-C3 group.

In some embodiments, the first compound or first precursor includes one or more unsaturated bonds that can be coordinated with a functional group, such as a hydroxyl group, on the surface of the substrate or an intervening underlayer to improve adhesion of the photoresist layer to the substrate or underlayer.

In some embodiments, the second precursor or second compound is one or more selected from the group consisting of water, an amine, a borane, and a phosphine. In some embodiments, the amine has a formula $N_pH_nX_m$, where $0 \leq n \leq 3$, $0 \leq m \leq 3$, n+m=3 when p is 1, and n+m=4 when p is 2, and each X is independently halogen selected from the group consisting of F, Cl, Br, and I. In some embodiments, the borane has a formula $B_pH_nX_m$, where $0 \leq n \leq 3$, $0 \leq m \leq 3$, n+m=3 when p is 1, and n+m=4 when p is 2, and each X is independently halogen selected from the group consisting of F, Cl, Br, and I. In some embodiments, the phosphine has a formula $P_pH_nX_m$, where $0 \leq n \leq 3$, $0 \leq m \leq 3$, n+m=3, when p is 1, or n+m=4 when p is 2, and each X is independently halogen selected from the group consisting of F, Cl, Br, and I.

In some embodiments, the second precursor or compound is ammonia or hydrazine. The reaction product of the ammonia or hydrazine and the organometallic precursor or compound may form hydrogen bonds that increase the boiling point of the reaction product and prevent emission of the metal photoresist material, thereby preventing metal contamination. The hydrogen bonds can also help prevent moisture effects to the photoresist layer quality.

In some embodiments, the operation S110 of depositing a photoresist composition is performed by a vapor phase deposition operation. In some embodiments, the vapor phase deposition operation includes atomic layer deposition (ALD) or chemical vapor deposition (CVD). In some embodiments, the ALD includes plasma-enhanced atomic layer deposition (PE-ALD), and the CVD includes plasma-enhanced chemical vapor deposition (PE-CVD), metal-organic chemical vapor deposition (MO-CVD); atmospheric pressure chemical vapor deposition (AP-CVD), and low pressure chemical vapor deposition (LP-CVD). The depositing a photoresist layer includes combining the first compound or first precursor and the second compound or second precursor in a vapor state to form the photoresist composition. In some embodiments, the first compound or first precursor and the second compound or second precursor of the photoresist composition are introduced into the deposition chamber (CVD chamber) at about the same time. In some embodiments, the first compound or first precursor and second compound or second precursor are introduced into the deposition chamber (ALD chamber) in an alternating manner, i.e.—first one compound or precursor then a second compound or precursor, and then subsequently alternately repeating the introduction of the one compound or precursor followed by the second compound or precursor.

In some embodiments, the deposition chamber temperature ranges from about 30° C. to about 400° C. during the deposition operation, and between about 50° C. to about 250° C. in other embodiments. In some embodiments, the pressure in the deposition chamber ranges from about 5 mTorr to about 100 Torr during the deposition operation, and between about 100 mTorr to about 10 Torr in other embodiments. In some embodiments, the plasma power is less than about 1000 W. In some embodiments, the plasma power ranges from about 100 W to about 900 W. In some embodiments, the flow rate of the first compound or precursor and the second compound or precursor ranges from about 100 sccm to about 1000 sccm. In some embodiments, the ratio of the flow of the organometallic compound or precursor to the second compound or precursor ranges from about 1:1 to about 1:10 and ranges from about 1:3 to 1:6 in other embodiments. At operating parameters outside the above recited ranges, unsatisfactory photoresist layers result in some embodiments. In some embodiments, the photoresist layer formation occurs in a single chamber (a one-pot layer formation).

In a CVD process according to some embodiments of the disclosure, two or more gas streams, in separate inlet paths, of an organometallic precursor and a second precursor are introduced to the deposition chamber of a CVD apparatus, where they mix and react in the gas phase, to form a reaction product. The streams are introduced using separate injection inlets or a dual-plenum showerhead in some embodiments. The deposition apparatus is configured so that the streams of organometallic precursor and second precursor are mixed in the chamber, allowing the organometallic precursor and second precursor to react to form a reaction product. Without limiting the mechanism, function, or utility of the disclosure, it is believed that the product from the vapor-phase reaction becomes heavier in molecular weight, and is then condensed or otherwise deposited onto the substrate.

In some embodiments, an ALD process is used to deposit the photoresist layer. During ALD, a layer is grown on a substrate by exposing the surface of the substrate to alternate gaseous compounds (or precursors). In contrast to CVD, the precursors are introduced as a series of sequential, non-overlapping pulses. In each of these pulses the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.

In an embodiment of an ALD process, an organometallic precursor is pulsed to deliver the metal-containing precursor to the substrate surface in a first half reaction. In some embodiments, the organometallic precursor reacts with a suitable underlying species (for example OH or NH functionality on the surface of the substrate) to form a new self-saturating surface. Excess unused reactants and the reaction by-products are removed, by an evacuation-pump down and/or by a flowing an inert purge gas in some embodiments. Then, a second precursor, such as water or ammonia ($NH_3$), is pulsed to the deposition chamber in some embodiments. The water or $NH_3$ reacts with the organometallic precursor on the substrate to obtain a reaction product photoresist on the substrate surface. The second precursor also forms self saturating bonds with the underlying reactive species to provide another self-limiting and saturating second half reaction. A second purge is performed to remove unused reactants and the reaction by-products in some embodiments. Pulses of the first precursor and second precursor are alternated with intervening purge operations until a desired thickness of the photoresist layer 15 is achieved.

In some embodiments, the photoresist layer 15 is formed to a thickness of about 5 nm to about 50 nm, and to a thickness of about 10 nm to about 30 nm in other embodiments. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the photoresist layer. The photoresist layer thickness are relatively uniform to facilitate processing. In some embodiments, the variation in thickness of the coating varies by no more than ±25% from the average coating thickness, in other embodiments the photoresist layer thickness varies by no more than ±10% from the average photoresist layer thickness. In some embodiments, such as high uniformity coatings on larger substrates, the evaluation of the photoresist layer uniformity may be evaluated with a 1 centimeter edge exclusion, i.e., the layer uniformity is not evaluated for portions of the coating within 1 centimeter of the edge. A person of ordinary skill in the art will recognize that additional ranges within the explicit ranges above are contemplated and are within the present disclosure.

In some embodiments, the first and second compounds or precursors are delivered into the deposition chamber with a carrier gas. The carrier gas, a purge gas, a deposition gas, or other process gas may contain nitrogen, hydrogen, argon, neon, helium, or combinations thereof.

Figure 8:
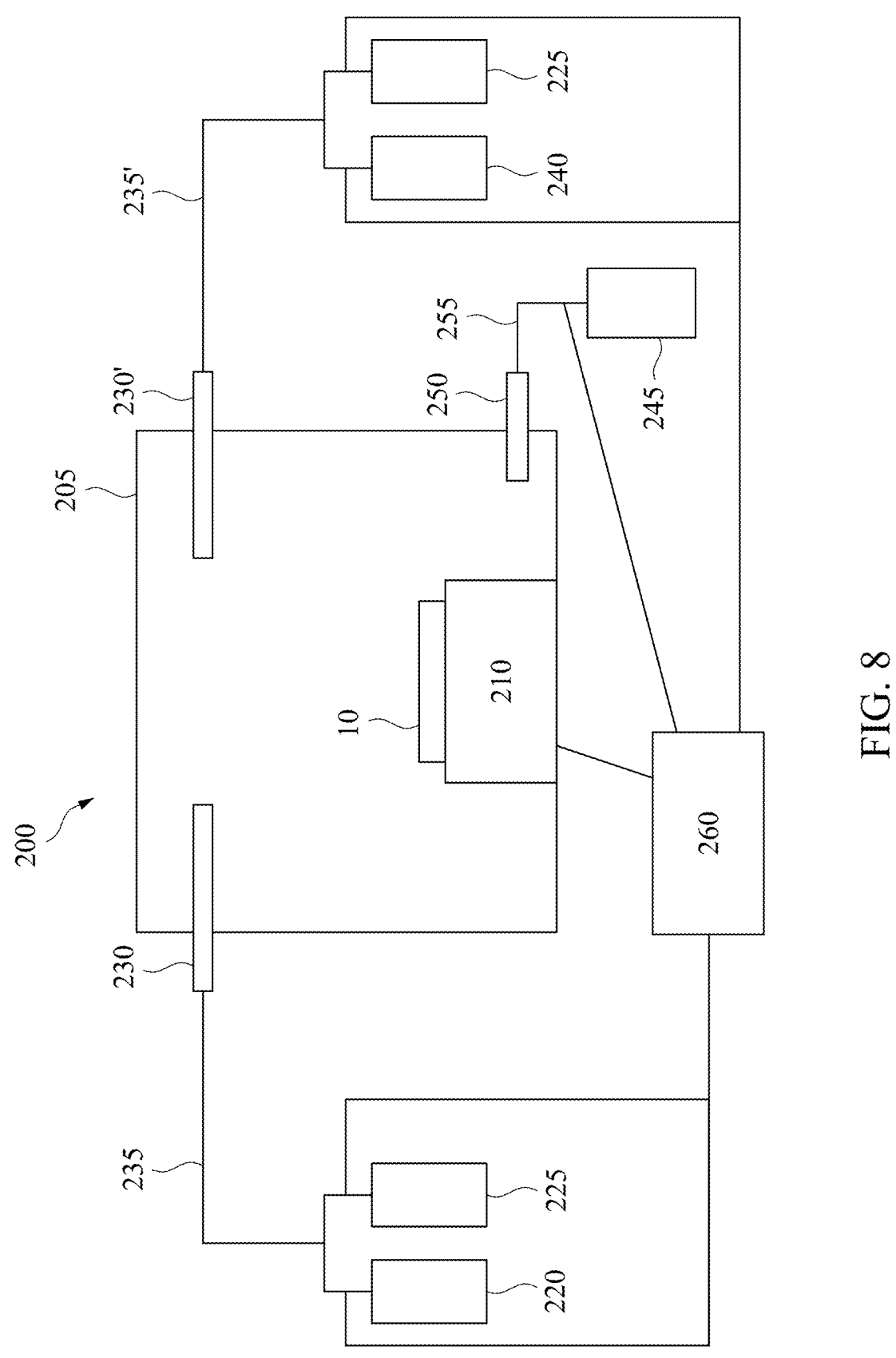
FIG. 8 shows a photoresist deposition apparatus according to some embodiments of the disclosure.

A resist layer deposition apparatus 200 according to some embodiments of the disclosure is shown in FIG. 8. In some embodiments, the deposition apparatus 200 is an ALD or CVD apparatus. The deposition apparatus 200 includes a vacuum chamber 205. A substrate support stage 210 in the vacuum chamber 205 supports a substrate 10, such as silicon wafer. In some embodiments, the substrate support stage 210 includes a heater. A first precursor or compound gas supply 220 and carrier/purge gas supply 225 are connected to an inlet 230 in the chamber via a gas line 235, and a second precursor or compound gas supply 240 and carrier/purge gas supply 225 are connected to another inlet 230' in the chamber via another gas line 235' in some embodiments. The chamber is evacuated, and excess reactants and reaction byproducts are removed by a vacuum pump 245 via an outlet 250 and exhaust line 255. In some embodiments, the flow rate or pulses of precursor gases and carrier/purge gases, evacuation of excess reactants and reaction byproducts, pressure inside the vacuum chamber 205, and temperature of the vacuum chamber 205 or wafer support stage 210 are controlled by a controller 260 configured to control each of these parameters.

In some embodiments, the organometallic compound includes tin (Sn), antimony (Sb), bismuth (Bi), indium (In), and/or tellurium (Te) as the metal component, however, the disclosure is not limited to these metals. In other embodiments, additional suitable metals include titanium (Ti), zirconium (Zr), hafnium (Hf), vanadium (V), cobalt (Co), molybdenum (Mo), tungsten (W), aluminum (Al), gallium (Ga), silicon (Si), germanium (Ge), phosphorus (P), arsenic (As), yttrium (Y), lanthanum (La), cerium (Ce), lutetium (Lu), or combinations thereof. The additional metals can be alternatives to or in addition to the Sn, Sb, Bi, In, and/or Te.

The particular metal used may significantly influence the absorption of radiation. Therefore, the metal component can be selected based on the desired radiation and absorption cross section. Tin, antimony, bismuth, tellurium, and indium provide strong absorption of extreme ultraviolet light at 13.5 nm. Hafnium provides good absorption of electron beam and extreme UV radiation. Metal compositions including titanium, vanadium, molybdenum, or tungsten have strong absorption at longer wavelengths, to provide, for example, sensitivity to 248 nm wavelength ultraviolet light.

In some embodiments, the ALD or CVD deposition parameters are varied during the deposition operation to form a photoresist layer having a density gradient. In some embodiments, the density gradient photoresist layer reduces defects, such as scum and bridging; and improves the line width roughness (LWR) and line edge roughness (LER).

Figure 9A:
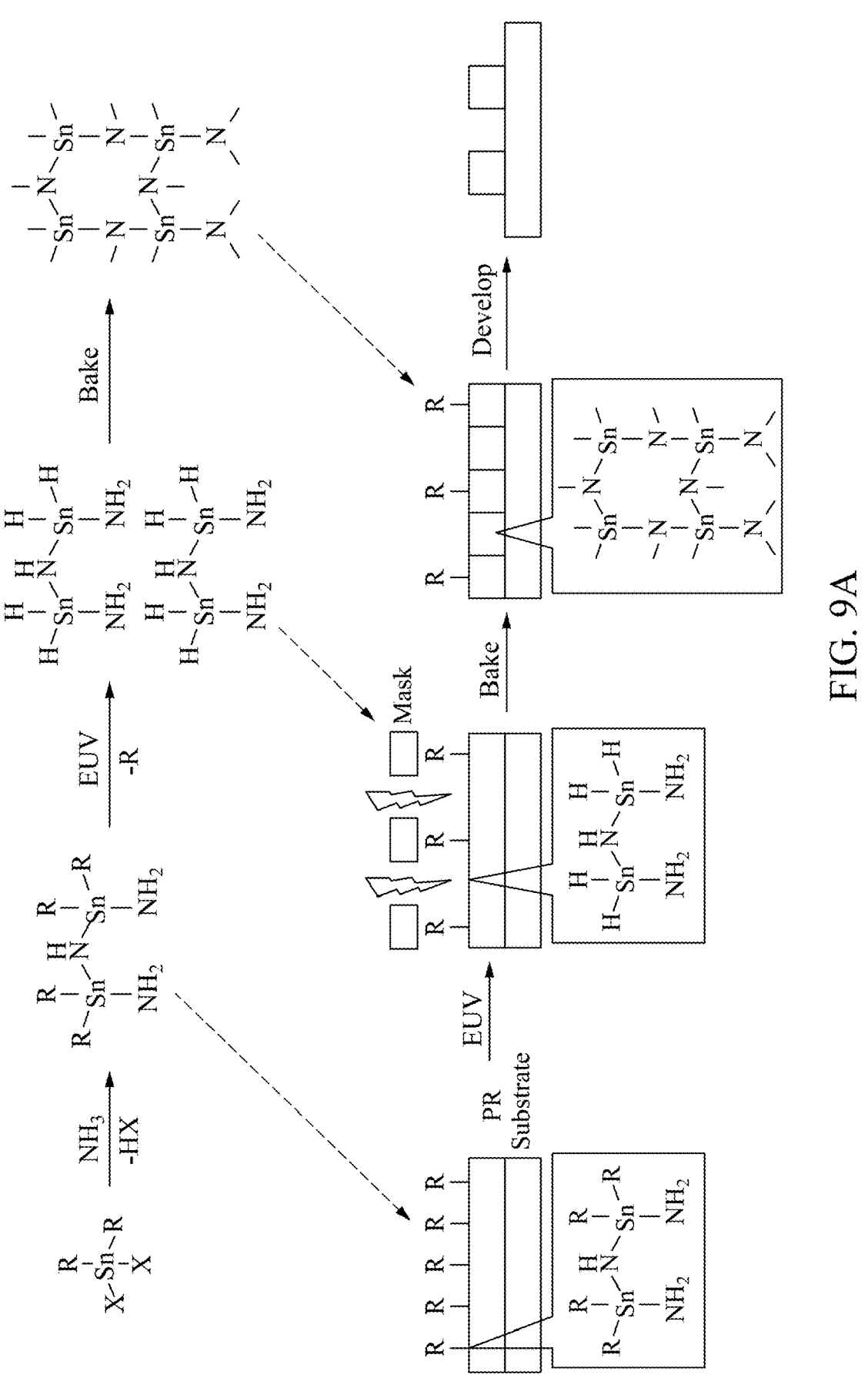
FIG. 9A shows a reaction the photoresist layer undergoes as a result of exposure to actinic radiation and heating according to an embodiment of the disclosure.

FIG. 9A shows a reaction the photoresist composition components undergo as a result of exposure to actinic radiation and heating according to an embodiment of the disclosure. FIG. 9A shows an exemplary chemical structure of the photoresist layer (PR) at various stages of the photoresist patterning method according to embodiments of the disclosure. As shown in FIG. 9A, the photoresist composition includes an organometallic compound, for example $SnX_2R_2$, and a second compound, for example ammonia ($NH_3$). When the organometallic compound and the ammonia are combined, the organometallic compound reacts with some of the ammonia in the vapor phase to form a reaction product with amine groups attached to the metal (Sn) of the organometallic compound. The amine groups in the as deposited photoresist layer have hydrogen bonds that can substantially increase the boiling point of the deposited photoresist layer and prevent the outgassing of metal-containing photoresist material, thereby preventing contamination of the deposition chamber and semiconductor device processing equipment by the metal in the metal-containing photoresist. Moreover, the hydrogen bonds of the amine groups can control the effect moisture has on photoresist layer quality.

When subsequently exposed to extreme ultraviolet radiation using a mask, the organometallic compound absorbs the extreme ultraviolet radiation and one or more organic R groups are cleaved from the organometallic compound to form an amino metallic compound in the radiation exposed areas. Then, when the post-exposure bake (PEB) performed, the amino metallic compounds crosslink through the amine groups in some embodiments, as shown in FIG. 9A. In some embodiments, partial crosslinking of the amino metallic compounds occurs as a result of the exposure to extreme ultraviolet radiation. The selectively exposed photoresist is subsequently developed, and the crosslinked radiation exposed pattern remains over the substrate while the radiation unexposed areas are removed during the development.

Figure 9B:
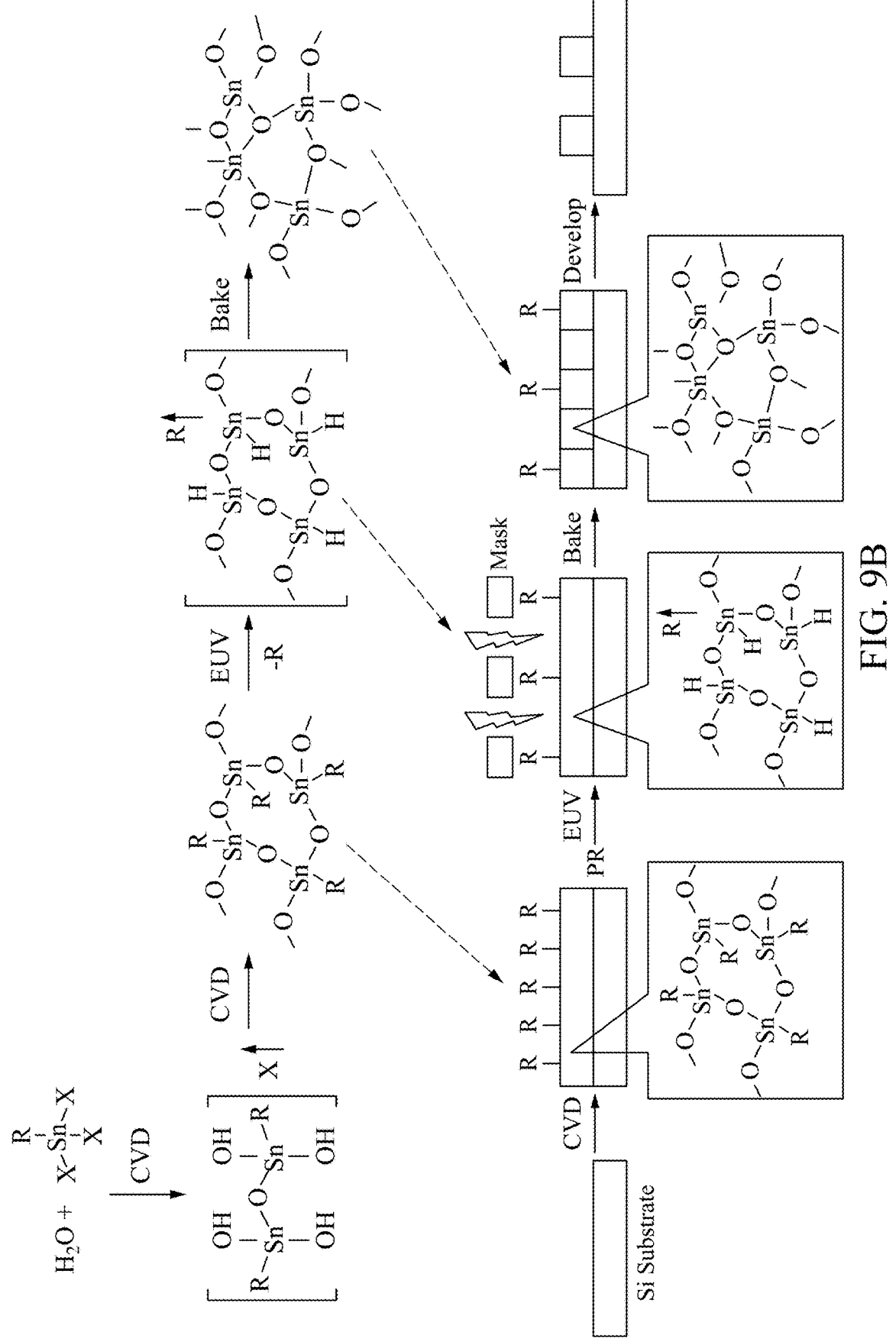
FIG. 9B shows a reaction the photoresist layer undergoes as a result of exposure to actinic radiation and heating according to an embodiment of the disclosure.

FIG. 9B shows a reaction the photoresist composition components undergo as a result of exposure to actinic radiation and heating according to an embodiment of the disclosure. FIG. 9B shows an exemplary chemical structure of the photoresist layer (PR) at various stages of the photoresist patterning method according to embodiments of the disclosure. As shown in FIG. 9B, the photoresist composition includes an organometallic compound, for example $SnX_3R$, and a second compound, for example water ($H_2O$). When the organometallic compound and the water (vapor) are combined in a CVD process, the organometallic compound reacts with some of the water in the vapor phase to form a reaction product with hydroxy groups (—OH) attached to the metal (Sn) of the organometallic compound, by substituting X with —OH. Further, the reaction product is subjected to a CVD process to form a film over the substrate, in which the hydroxy metallic compounds cross-link through the hydroxy groups in some embodiments, The crosslinked structure in the as deposited photoresist layer can substantially increase the boiling point of the deposited photoresist layer and prevent the outgassing of metal-containing photoresist material, thereby preventing contamination of the deposition chamber and semiconductor device processing equipment by the metal in the metal-containing photoresist.

When subsequently exposed to extreme ultraviolet radiation using a mask, the organometallic compound absorbs the extreme ultraviolet radiation and one or more organic R groups are cleaved from the organometallic compound to form a crosslinked metal oxide compound in the radiation exposed areas. In some embodiments, hydrogen is left when the organic R groups are cleaved. Then, when the post-exposure bake (PEB) is performed, the crosslinked metal oxide compounds further crosslink through the hydrogen and oxygen in some embodiments, as shown in FIG. 9B. In some embodiments, partial crosslinking occurs as a result of the exposure to extreme ultraviolet radiation. The selectively exposed photoresist is subsequently developed, and the crosslinked radiation exposed pattern remains over the sub-strate while the radiation unexposed areas are removed during the development.

Figure 10:
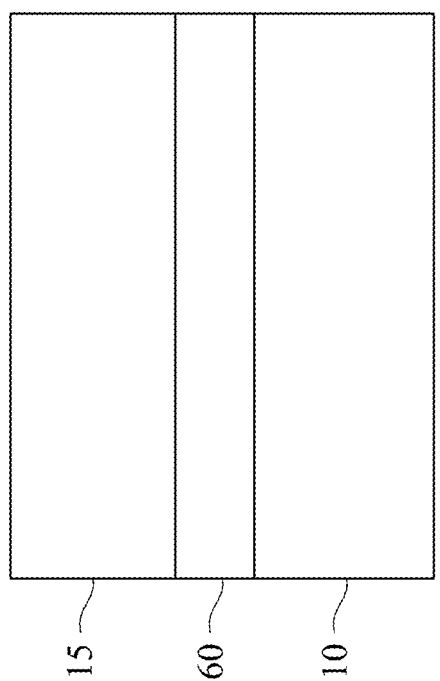
FIG. 10 shows a process stage of a sequential operation according to an embodiment of the disclosure.

In some embodiments, a layer to be patterned (target layer) 60 is disposed over the substrate prior to forming the photoresist layer, as shown in FIG. 10. In some embodiments, the layer to be patterned 60 is a metallization layer or a dielectric layer, such as a hard mask layer, an interlayer dielectric layer or a passivation layer, disposed over a metallization layer. In other embodiments, the target layer is a bottom antireflective coating (BARC) layer made of an organic polymer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation tech-niques, including thermal oxidation, chemical vapor depo-sition, atomic layer deposition, and physical vapor deposi-tion.

Figure 11A:
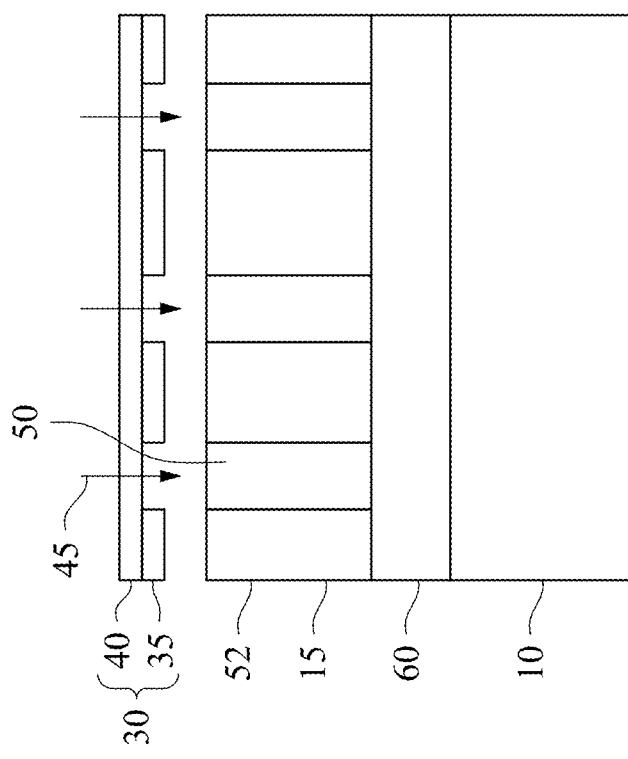
FIGS. 11A and 11B show a process stage of a sequential operation according to an embodiment of the disclosure.
Figure 11B:
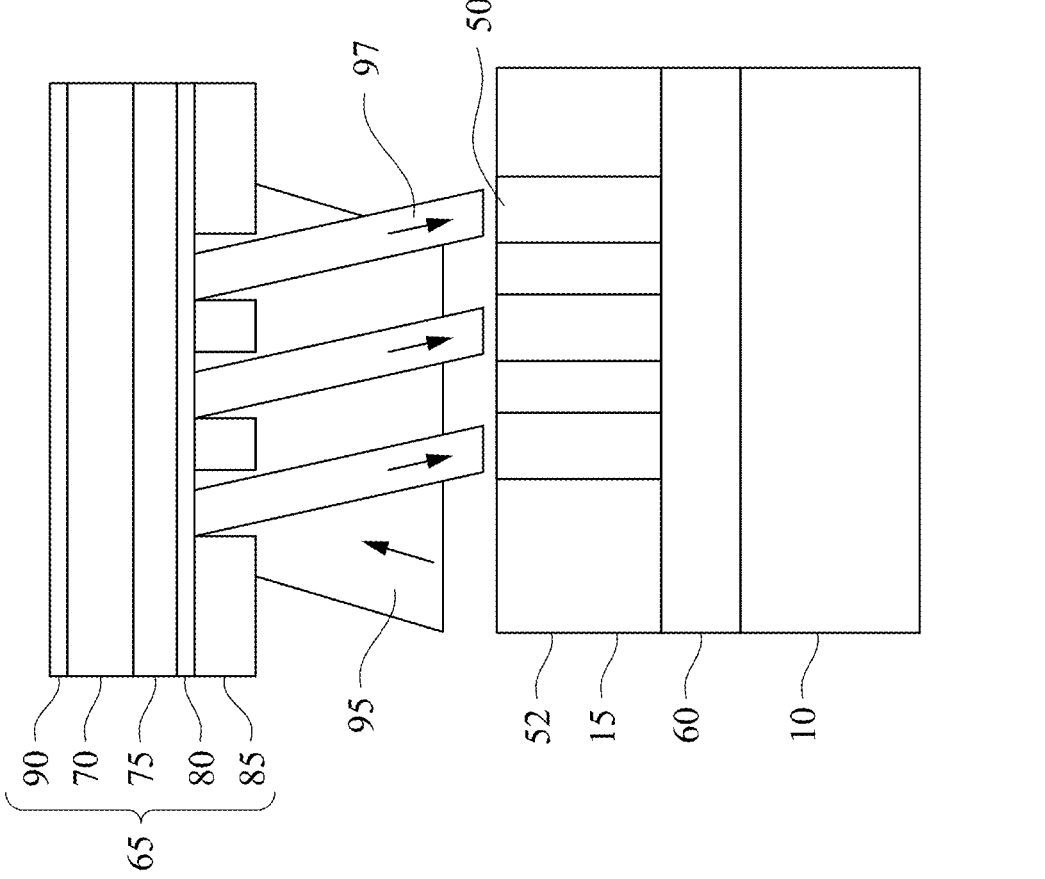

The photoresist layer 15 is subsequently selectively exposed to actinic radiation 45 to form exposed regions 50 and unexposed regions 52 in the photoresist layer, as shown in FIGS. 11A and 11B, and described herein in relation to FIGS. 3A and 3B. As explained herein the photoresist is a negative-tone photoresist in some embodiments.

Figure 12A:
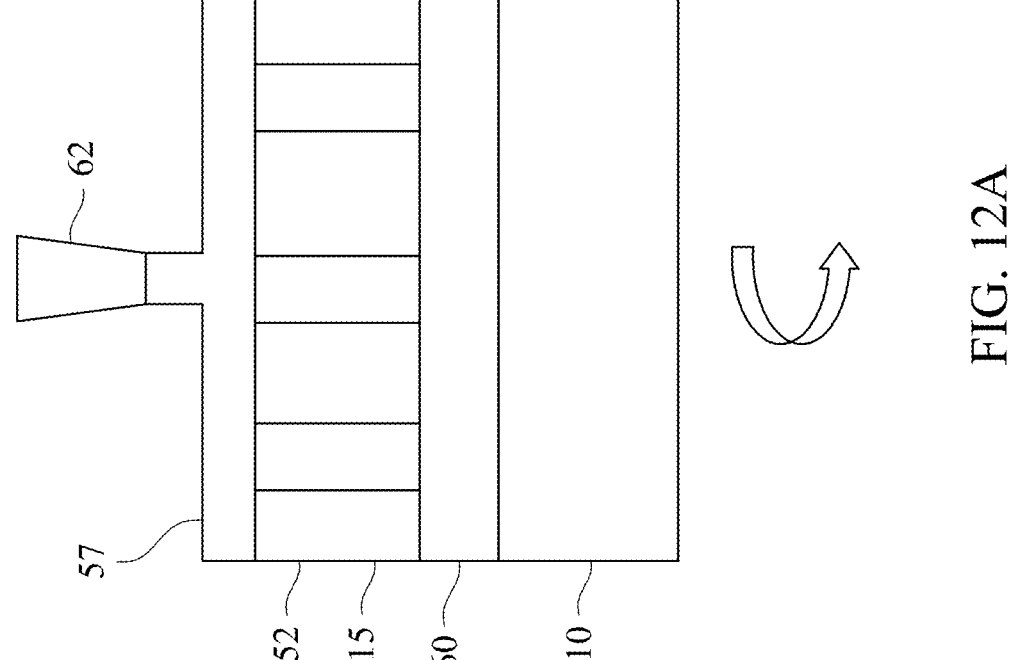
FIGS. 12A and 12B show a process stage of a sequential operation according to an embodiment of the disclosure.
Figure 12B:
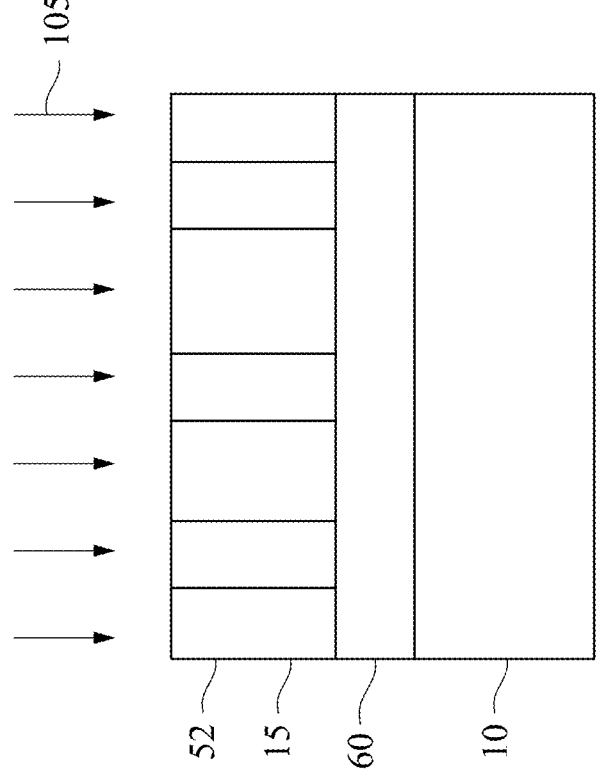
Figures 13, 14:
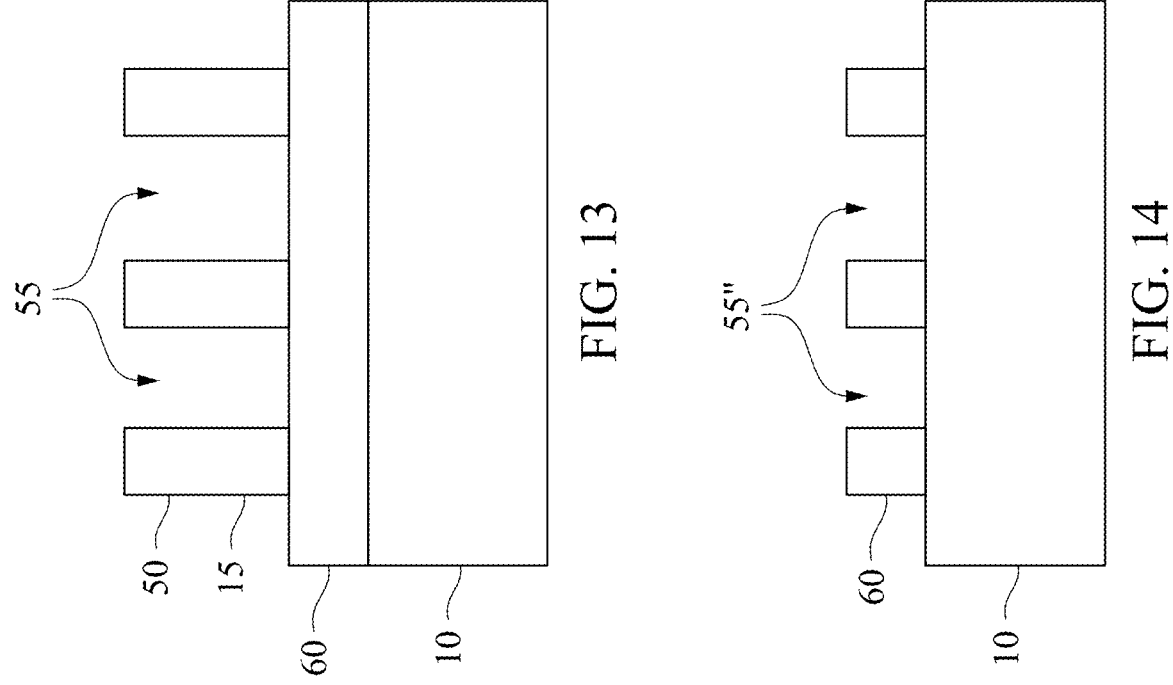
FIG. 13 shows a process stage of a sequential operation according to an embodiment of the disclosure.
FIG. 14 shows a process stage of a sequential operation according to an embodiment of the disclosure.

The unexposed photoresist regions 52 are developed by dispensing developer 57 from a dispenser 62, as shown in FIG. 12A, or by a dry development operation, as shown in FIG. 12B to form a photoresist pattern 55, as shown in FIG. 13. The development operation is similar to that explained herein with reference to FIGS. 4A, 4B, and 5.

Then as shown in FIG. 14, the pattern 55 in the photoresist layer 15 is transferred to the layer to be patterned 60 using an etching operation and the photoresist layer is removed, as explained with reference to FIG. 6 to form pattern 55" in the layer to be patterned 60.

FIGS. 15A-15J shows various stages of a sequential manufacturing operation of a semiconductor device accord-ing to embodiments of the present disclosure. It is under-stood that additional operations can be provided before, during, and after the processes shown by FIGS. 15A-15J, and some of the operations described below are replaced or eliminated, for additional embodiments of the method. The order of the operations/processes may be interchangeable. Material, configuration, dimensions and/or processes the same as or similar to the foregoing embodiments described with FIGS. 1-14 may be employed in the following embodi-ments, and detailed explanation thereof may be omitted.

FIGS. 15A-15F show an operation in case of a positive tone developer. As shown in FIG. 15A, a target layer 12 to be patterned is formed over a substrate 10. In some embodi-ments, the target layer 12 is a conductive layer, such as a metal or metallic layer (Ti, TiN, Ta, TaN, W, Cu, Al, Co, Ni, Mo, Ru, or alloy thereof, or any suitable conductive material used in a semiconductor fabrication) or a semiconductor layer (amorphous, polycrystalline or crystalline Si, SiGe or Ge, doped or non-doped, or any suitable semiconductor material used in a semiconductor fabrication), or a dielectric layer, such as silicon oxide, silicon nitride, SiON, SiOC, SiOCN, SiCN, hafnium oxide, aluminum oxide or any suitable dielectric material used in a semiconductor fabri-cation. In some embodiments, a mask layer 14 is formed over the target layer 12. In some embodiments, the mask layer 14 includes a dielectric material, a semiconductor material or a conductive material sufficiently higher in etching resistivity than the target layer 12. In some embodi-ments, the mask layer 14 is an organic bottom antireflective coating (BARC). Further, a metal-containing resist layer 15 is formed over the mask layer 14 as set forth above.

Then, as shown in FIG. 15B, an exposure operation is performed on the metal-containing resist layer 15 by the EUV or DUV radiation reflected by or a passing through a photo mask having circuit patterns. Then, as shown in FIG. 15C, the exposed metal-containing resist layer 15 is devel-oped and removed by a wet developer or dry development. Next, as shown in FIG. 15D, the mask layer 14 is patterned by using the patterned metallic layer 15 as an etching mask. In some embodiments, the metal-containing resist layer 15 is then removed by using a suitable wet or dry etchant, as shown in FIG. 15E. Then, the target layer 12 is patterned by using the patterned mask layer 14 as an etching mask, and the mask layer 14 is removed, as shown in FIG. 15F. In some embodiments, the target layer 12 is patterned without removing the metal-containing resist layer 15. In some embodiments, the patterned mask layer 14 is not removed after the pattering of the target layer 12.

Figure 15H:
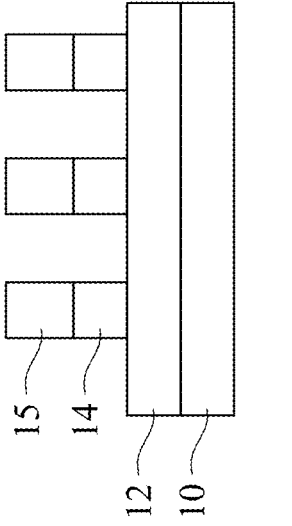
FIGS. 15G, 15H, 15I and 15J show various stages of a sequential manufacturing operation of a semiconductor device according to an embodiment of the present disclosure.
Figure 15J:
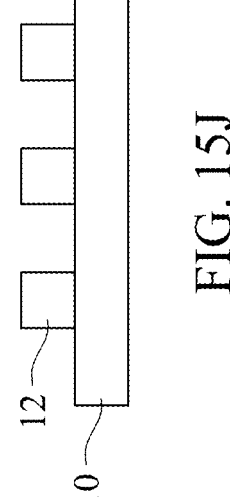
Figure 15G:
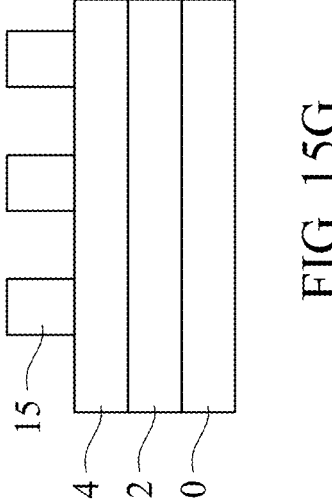
Figure 15I:
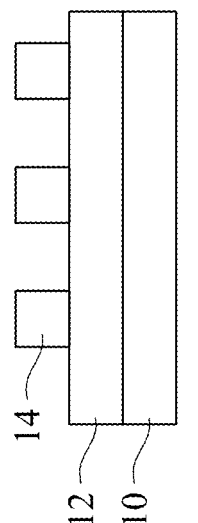

FIGS. 15G-15J show an operation in case of a negative tone developer. As shown in FIG. 15G, the non-exposed regions of the metal-containing resist layer 15 is developed and removed by a wet developer or dry development. The operations of FIGS. 15H, 15I and 15J are the same as those of FIGS. 15D, 15E and 15F.

Other embodiments include other operations before, dur-ing, or after the operations described above. In some embodiments, the disclosed methods include forming fin field effect transistor (FinFET) structures. In some embodi-ments, a plurality of active fins are formed on the semicon-ductor substrate. Such embodiments, further include etching the substrate through the openings of a patterned hard mask to form trenches in the substrate; filling the trenches with a dielectric material; performing a chemical mechanical pol-ishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof are formed, according to embodiments of the disclosure.

It will be understood that not all advantages have been necessarily discussed herein, no particular advantage is required for all embodiments or examples, and other embodiments or examples may offer different advantages.

Semiconductor formation methods and resist patterning methods according to the present disclosure provide improved resist material use efficiency and reduced use of potentially toxic organic solvents over solvent-based resists. Embodiments of the disclosure provide organotin precursors with lower Sn—C BDE resulting in the photoresist films with increased EUV-sensitivity at lower EUV dosage. Embodiments of the present disclosure provide a lower cost EUV patterning operation. Embodiments of the disclosure further provide a uniform photoresist film deposited on the surface of a semiconductor substrate. In addition, toxic organic solvents can be substantially eliminated from the photoresist patterning process because the photoresist is not solvent based, and dry development is performed without the use of a solvent-based developer in some embodiments. In some embodiments, contamination of the deposition chamber and semiconductor substrate handling equipment from metals in metal-containing photoresists is prevented. Photoresist moisture sensitivity issues are prevented by methods according to embodiments of the disclosure. Improved pattern resolution is provided by embodiments of the present disclosure. Embodiments of the disclosure provide improved line width roughness and improved distinction between exposed and unexposed portions of the photoresist. In addition, improved semiconductor device fabrication efficiency is provided by the one-pot deposition methods according to embodiments of the disclosure. The metal-containing photo resist can be used to form patterns having a dimension of about 5 nm to about 40 nm and having a low line width roughness (LWR) and high etching selectivity. In some embodiments, the LWR is improved by about 20% compared with a polymer based photo resist.

In accordance with one aspect of the present disclosure, in a method of manufacturing a semiconductor device, a photoresist layer is formed over a target layer to be patterned by combining a first precursor and a second precursor in a vapor state to form a photoresist material. The first precursor is an organometallic having a formula: $M_aR_bX_c$, where M is one or more selected from the group consisting of Sn, Bi, Sb, In, and Te, R is an alkyl group that is substituted by one or more of electron-donating groups (EDG) or electron-withdrawing groups (EWG), X is a halide or sulfonate group, and $1 \leq a \leq 2$, $b \geq 1$, $c \geq 1$, and $b+c \leq 4$, and the second precursor is one or more selected from the group consisting of water, an amine, a borane, and a phosphine. The photoresist material is deposited over the target layer to be patterned. The photoresist layer is selectively exposed to actinic radiation to form a latent pattern, and the latent pattern is developed by applying a developer to the selectively exposed photoresist layer to form a pattern. In one or more of the foregoing or following embodiments, R is a C1-C20 alkyl group, including all isomers of C1-C20 alkyl groups, substituted with an electron-donating group selected from one or more of the following —O⁻—NH₂, —NHR1, —NR1₂, —OH, —OR1, —NHCOR1, —SH, —SR1, phenyl group, and —(C═O) O—, where R1═C1-C4 groups or phenyl groups. In one or more of the foregoing or following embodiments, R is a C1-C20 alkyl group, including all isomers of C1-C20 alkyl groups, substituted with an electron-withdrawing group selected from one or more of —I, —Cl, —Br, —F, —NR2₃⁺, —NO₂, —SO₃H, —SO₂R₂, —CN, —CHO, —COR2, —CO₂H, —CO₂R2, —CONH2, —CONHR2, and —CONR2₂, where R2═C1-C4 groups or phenyl groups. In one or more of the foregoing or following embodiments, R is one or more C1-C4 alkyl groups substituted with a phenyl group, —NH₂, —NHR3, —NR3₂, —OH, —OR3, where R3═C1-C3 alkyl group or a phenyl group. In one or more of the foregoing or following embodiments, R is one or more C1-C4 alkyl groups substituted at the α-C position by one or two phenyl groups, —NH₂, —NHR4, —NR4₂, or —OR4, where R4═C1-C3 alkyl group. In one or more of the foregoing or following embodiments, the actinic radiation is extreme ultraviolet radiation. In one or more of the foregoing or following embodiments, after selectively exposing the photoresist layer to actinic radiation to form a latent pattern and before developing the latent pattern, post-exposure baking is performed on the photoresist layer. In one or more of the foregoing or following embodiments, the photoresist material is deposited over the target layer to be patterned by atomic layer deposition (ALD) or chemical vapor deposition (CVD). In one or more of the foregoing or following embodiments, the first precursor is a dimer connected by NH or O. In one or more of the foregoing or following embodiments, after selectively exposing the photoresist layer to actinic radiation to form a latent pattern and before developing the latent pattern, the photoresist layer is heated at a temperature ranging from 150° C. to 230° C. or 100° C. to 200° C. In one or more of the foregoing or following embodiments, the developer is a dry developer. In one or more of the foregoing or following embodiments, before selectively exposing the photoresist layer to actinic radiation to form a latent pattern, the photoresist layer is heated at a temperature ranging from 40° C. to 120° C.

In accordance with another aspect of the present disclosure, in a method of manufacturing a semiconductor device, a photoresist layer is formed over a target layer to be patterned by combining a first precursor and a second precursor in a vapor state to form a photoresist material. The first precursor is an organometallic having a formula: $M_aR_bX_c$, where M is one or more selected from the group consisting of Sn, Bi, Sb, In, and Te, R is an alkyl group that is substituted by one or more of electron-donating groups (EDG) or electron-withdrawing groups (EWG), X is a halide or sulfonate group, and a═1 or 2, b═2, and c═2, and the second precursor is one or more selected from the group consisting of water, an amine, a borane, and a phosphine. The photoresist material is deposited over the target layer to be patterned. The photoresist layer is selectively exposed to actinic radiation to form a latent pattern, and the latent pattern is developed by applying a developer to the selectively exposed photoresist layer to form a pattern. In one or more of the foregoing or following embodiments, a=1. In one or more of the foregoing or following embodiments, a=2 and the first precursor is an organometallic having a formula $MR_2X_2$—NH-$MR_2X_2$. In one or more of the foregoing or following embodiments, the second precursor is ammonia.

In accordance with another aspect of the present disclosure, in a method of manufacturing a semiconductor device, a photoresist layer is formed over a target layer to be patterned by combining a first precursor and a second precursor in a vapor state to form a photoresist material. The first precursor is an organometallic having a formula: $M_aR_bX_c$, where M is one or more selected from the group consisting of Sn, Bi, Sb, In, and Te, R is an alkyl group that is substituted by one or more of electron-donating groups (EDG) or electron-withdrawing groups (EWG), X is a halide or sulfonate group, and a=1 or 2, b=1, and c=3, and the second precursor is one or more selected from the group consisting of water, an amine, a borane, and a phosphine. The photoresist material is deposited over the target layer to be patterned. The photoresist layer is selectively exposed to actinic radiation to form a latent pattern, and the latent pattern is developed by applying a developer to the selectively exposed photoresist layer to form a pattern. In one or more of the foregoing or following embodiments, a=1. In one or more of the foregoing or following embodiments, a=2 and the first precursor is an organometallic having a formula $MRX_3$—O-$MRX_3$. In one or more of the foregoing or following embodiments, the second precursor is water vapor.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a layer of a reaction product of a first precursor and a second precursor over a substrate, wherein the first precursor is an organometallic having a formula:

$$M_aR_bX_c$$

where M is one or more selected from the group consisting of Sn, Bi, Sb, In, and Te, R is a C1-C20 alkyl group that is substituted by one or more of the following: —O⁻, —NH₂, —NHR1, —NR1₂, —OH, —OR1, —NHCOR1, —SH, —SR1, phenyl group, and —(C═O)O—, —I, —Cl, —Br, —F, —NR2₃⁺, —NO₂, —SO₃H, —SO₂R2, —CN, —CHO, —COR2, —CO₂H, —CO₂R2, —CONH₂, —CONHR2, and —CONR2₂, where R1 and R2=C1-C4 groups or phenyl groups, X is a halide or sulfonate group, 1≤a≤2, b≥1, c≥1, and b+c≤4, and the first precursor is a dimer connected by NH or O, and the second precursor is one or more selected from the group consisting of water, an amine, a borane, and a phosphine; and patterning the layer of the reaction product to selectively expose one or more portions of the substrate.

2. The method according to claim 1, wherein R is one or more C1-C4 alkyl groups substituted with a phenyl group, —NH₂, —NHR3, —NR3₂, —OH, —OR3, where R3=C1-C3 alkyl group or a phenyl group.

3. The method according to claim 1, wherein R is one or more C1-C4 alkyl groups substituted at the α-C position by one or two phenyl groups, —NH₂, —NHR4, —NR4₂, or —OR4, where R4=C1-C3 alkyl group.

4. The method according to claim 1, wherein the patterning the layer of the reaction product comprises:

selectively exposing the layer of the reaction product to extreme ultraviolet radiation; and developing the selectively exposed layer of the reaction product.

5. The method according to claim 4, further comprising after the selectively exposing the layer of the reaction product to extreme ultraviolet radiation and before the developing, heating the layer of the reaction product at a temperature ranging from 150° C. to 230° C.

6. The method according to claim 4, wherein a dry developer is applied to the layer of the reaction product during the developing.

7. The method according to claim 4, further comprising before selectively exposing the layer of the reaction product to extreme ultraviolet radiation, heating the layer of the reaction product at a temperature ranging from 40° C. to 120° C.

8. The method according to claim 1, wherein the layer of the reaction product is deposited over the substrate by atomic layer deposition (ALD) or chemical vapor deposition (CVD).

9. A method of manufacturing a semiconductor device, comprising:

forming a resist layer over a substrate, wherein the forming the resist layer comprises a reaction product of a first precursor and a second precursor, wherein the first precursor is an organometallic having a formula:

$$MR_2X_2\text{—NH-}MR_2X_2$$

where M is one or more selected from the group consisting of Sn, Bi, Sb, In, and Te, R is an alkyl group that is substituted by one or more of electron-donating groups (EDG) or electron-withdrawing groups (EWG), X is a halide or sulfonate group, and the second precursor is one or more selected from the group consisting of water, an amine, a borane, and a phosphine; and patterning the resist layer to selectively expose portions of the substrate.

10. The method according to claim 9, wherein the second precursor is ammonia.

11. The method according to claim 9, wherein R is one or more C1-C4 alkyl groups substituted with a phenyl group, —NH₂, —NHR3, —NR3₂, —OH, —OR3, where R3=C1-C3 alkyl group or a phenyl group.

12. The method according to claim 9, wherein R is one or more C1-C4 alkyl groups substituted at the α-C position by one or two phenyl groups, —NH₂, —NHR4, —NR4₂, or —OR4, where R4=C1-C3 alkyl group.

13. The method according to claim 9, wherein the patterning the resist layer comprises:

selectively exposing the resist layer to extreme ultraviolet radiation; and developing the selectively exposed resist layer.

14. The method according to claim 13, further comprising after the selectively exposing the resist layer to extreme ultraviolet radiation and before the developing, heating the resist layer at a temperature ranging from 150° C. to 230° C.

15. The method according to claim 13, further comprising before the selectively exposing the resist layer to extreme ultraviolet radiation, heating the resist layer at a temperature ranging from 40° C. to 120° C.

16. A method of manufacturing a semiconductor device, comprising:

forming a resist layer over a substrate, wherein the resist layer comprises a reaction product of a first precursor and a second precursor, wherein the first precursor is an organometallic having a formula:

$$MRX_3—O-MRX_3$$

where M includes one or more of Sn, Bi, Sb, In, or Te,

R is an alkyl group that is substituted by one or more of electron-donating groups (EDG) or electron-withdrawing groups (EWG), and X is a halide or sulfonate group, and the second precursor includes one or more of water, an amine, a borane, or a phosphine; and patterning the resist layer to selectively expose portions of the substrate.

17. The method according to claim 16, wherein the second precursor is water vapor.

18. The method according to claim 16, wherein R is one or more C1-C4 alkyl groups substituted with a phenyl group, $—NH_2$, —NHR3, $—NR3_2$, —OH, —OR3, where R3=C1-C3 alkyl group or a phenyl group.

19. The method according to claim 16, wherein R is one or more C1-C4 alkyl groups substituted at the $\alpha$-C position by one or two phenyl groups, $—NH_2$, —NHR4, $—NR4_2$, or —OR4, where R4=C1-C3 alkyl group.

20. The method according to claim 16, wherein the patterning the resist layer comprises:

selectively exposing the resist layer to extreme ultraviolet radiation; and developing the selectively exposed resist layer.

* * * * *